United States Patent
Watanabe et al.

(10) Patent No.: US 7,075,088 B2
(45) Date of Patent: Jul. 11, 2006

(54) TWO-DIMENSIONAL RADIATION DETECTOR

(75) Inventors: Narumi Watanabe, Uji (JP); Toshinori Yoshimuta, Takatsuki (JP)

(73) Assignee: Shimadzu Corporation, Kyoto-Fu (JP)

(*) Notice: Subject to any disclaimer, the term of this patent is extended or adjusted under 35 U.S.C. 154(b) by 0 days.

(21) Appl. No.: 11/102,374

(22) Filed: Apr. 8, 2005

(65) Prior Publication Data

US 2005/0230629 A1    Oct. 20, 2005

(30) Foreign Application Priority Data

Apr. 19, 2004  (JP) .............................. 2004-122806

(51) Int. Cl.
*G01T 1/24* (2006.01)
(52) U.S. Cl. ................................. 250/370.01
(58) Field of Classification Search ............ 250/370.01
See application file for complete search history.

(56) References Cited

U.S. PATENT DOCUMENTS

| | | | | |
|---|---|---|---|---|
| 5,451,794 A | * | 9/1995 | McKeown et al. ...... | 250/492.3 |
| 6,376,857 B1 | * | 4/2002 | Imai ........................... | 250/591 |
| 6,442,043 B1 | * | 8/2002 | Seki et al. ................ | 361/761 |
| 6,667,480 B1 | * | 12/2003 | Kajiwara et al. ...... | 250/370.01 |
| 6,989,539 B1 | * | 1/2006 | Wischmann et al. ... | 250/370.11 |
| 2004/0079891 A1 | | 4/2004 | Sato et al. | |
| 2004/0183025 A1 | * | 9/2004 | Sato ...................... | 250/370.11 |

OTHER PUBLICATIONS

Patent Abstracts of Japan for JP2003-058487 published Feb. 28, 2003.

* cited by examiner

*Primary Examiner*—David Porta
*Assistant Examiner*—Marcus Taningco
(74) *Attorney, Agent, or Firm*—Darby & Darby

(57) ABSTRACT

A radiation detector is provided that has no fluctuations in detection sensitivity and is capable of suppressing the influence of the noise emitted from a light source. In the radiation detector in the present invention, a light emitting unit applies light to the end face of a flat light guide. On receiving the light, the flat light guide emits flat light from its surface toward an active matrix substrate. The light is led to a semiconductor thick film after passing through the active matrix substrate. The noise emitted from the light emitting unit to the active matrix substrate or the semiconductor thick film can be blocked by an electromagnetic shield. An incident radiation to the semiconductor thick film in this condition can be detected while the effect of the noise emitted from the light emitting unit is suppressed, and fluctuations in radiation sensitivity do not occur.

6 Claims, 4 Drawing Sheets

PRIOR ART

TWO-DIMENSIONAL RADIATION DETECTOR

INCORPORATION BY REFERENCE

The present application claims priority under 35 U.S.C. §119 to Japanese Patent Application No. 2004-122806 filed on Apr. 19, 2004. The content of the application is incorporated herein by reference in its entirety.

BACKGROUND OF THE INVENTION

The present invention relates to a two-dimensional radiation detector for use in medical, industrial as well as atomic power fields and the like to detect radiation.

In the conventional art, the radiation detector of this type contains a radiation sensitive radiation converting layer (semiconductor layer) that converts radiation information into electric charge information and an active matrix substrate that reads out the converted electric charge.

In the conventional radiation detector, the electric charge information obtained at the radiation converting layer is read out by the active matrix substrate, wherein the electric charge information is processed by an amplifier and the like, and output externally as radiation detection signals. The radiation detection signals obtained in such a way are used to generate a fluorographic image or the like.

However, this type of conventional technology has the following problems.

A phenomenon of fluctuation in the detection sensitivity of the radiation converting layer occurs. A phenomenon of occurrence of residual output also occurs. It has been recognized that such problems may occur, and the solution to the problems has been sought by the prior invention described in the specification of the prior patent application (Japanese Patent Application Number 2003-058487) (hereinafter referred as "the prior invention").

One of the embodiments of the radiation detector in the prior invention is shown in FIG. 5 and FIG. 6. FIG. 5 is a simplified diagram of the principal part of the radiation detector of the prior invention, and FIG. 6 explains the actions of the principal part of the radiation detector of the prior invention. The radiation detector of the prior invention includes a radiation converting layer 51, an active matrix substrate 53, and a light source 55 under the active matrix substrate 53, wherein the light source applies light to the radiation converting layer 51. Furthermore, a carrier collecting electrode 57 that is divided into multiple pieces is disposed on the bottom surface of the radiation converting layer 57.

In the radiation detector composed in this way, the light source 55 applies light before a radiation incidence. As shown in FIG. 6, the electric charge generated by the light stays in regions A in the space between the carrier collecting electrodes 57. Therefore, the lines of electric force in the radiation converting layer are distorted as shown by the arrows with the dotted lines.

When incidence of radiation occurs while the light source 55 applies light, no further accumulation of electric charge occurs in the spaces between the carrier collecting electrodes 57. Therefore, the conditions of the lines of electric force and the effective sensitive area does not change and fluctuations in the detection sensitivity do not occur. When the application of the light from the light source 55 is continued after incidence of radiation stops, the electric charges accumulating in the spaces between the carrier collecting electrodes 57 are not taken out gradually and residual output does not occur. Therefore, the radiation information can be converted into the electric charge information properly without fluctuations in the radiation sensitivity.

Here, an embodiment of the light source 55 may be a transparent plate in which a light emitting diode is mounted horizontally. The light source is not restricted to a light emitting diode. However, any kind of light source selected requires a power supply and an ordinary switching type power supply is suitable for this purpose because the switching type power supply is small, light weight and high capacity.

Furthermore, any light source requires a suitable lighting circuit. For example, the light emitting diode described above requires a current limiting circuit and a cold cathode tube or the like requires a voltage boosting circuit or the like involving an inverter.

The prior invention with such a composition has turned out to have following problems.

The electric power supplied to the light source 55 contains many switching pulses, and the light source 55 has a lighting circuit. Therefore, the noise caused by switching pulses and the lighting circuit is emitted from the light source 55. Electric charge information is generated by the emitted noise at the radiation converting layer 51 or the active matrix substrate 53. Consequently the radiation detector of the prior invention detects not only the electric charge information converted from the radiation information but also the electric charge information from such noise (noise component). Since the charge information converted from radiation itself is weak, the influence of the noise component overlapping on the charge information converted from the radiation is significant.

SUMMARY OF THE INVENTION

The present invention is developed by taking such problems into consideration. The object of the present invention is to provide a radiation detector that has no fluctuations in detection sensitivity and can suppress the influence of the noise emitted from the light source.

In order to achieve the objects described above, the present invention is structured as follows.

One implementation of the present invention provides a two-dimensional radiation detector including: a semiconductor layer for converting radiation information into electric charge information when there is an incidence of radiation; an active matrix substrate, on the surface of which said semiconductor layer is laid, for reading said electric charge information from said semiconductor layer; a light emitting means for emitting light; and a flat light guide placed on the reverse side of said active matrix substrate for receiving light through an end face from said light emitting means and guiding said light to said semiconductor layer by way of said active matrix substrate. An electromagnetic shield is disposed in a region between said light emitting means and said active matrix substrate where said light emitting means faces said active matrix substrate.

With the above implementation of the invention, light emitting means applies the light to the end face of the flat light guide. On receiving the light, the flat light guide emits flat light from the surface thereof toward the active matrix substrate. Since the active matrix substrate is transparent, the light enters the semiconductor layer. The light emitted from the light source is applied to the semiconductor layer by this process.

The noise emitted from light emitting means to the active matrix substrate or the semiconductor layer is blocked by the electromagnetic shield. Thus the overlapping of the charge information converted from the radiation information with the noise component can be prevented.

Consequently the radiation can be detected, without fluctuations of the detection sensitivity to radiation, by suppressing the influence of the noise emitted from light emitting means.

In another embodiment of the invention, the electromagnetic shield surrounds light emitting means and an opening is disposed thereon so that the light from light emitting means may be applied to the end face of the flat light guide.

With the above implementation of the invention, the electromagnetic shield covers light emitting means so that it is not exposed but a light passage is secured for light emitting means to apply the light to the end face of the flat light guide. Thus the noise, which is emitted from light emitting means in directions other than the active matrix substrate or the semiconductor layer, is also shielded. Therefore, the influence of the noise to the semiconductor layer and the active matrix substrate can be suppressed more efficiently. Furthermore, the influence of the noise on the surrounding circuits of the radiation detector can be similarly suppressed.

In another implementation of the invention, the detector further includes power distributing means for supplying power from an external power supply to light emitting means. Power distributing means includes a conductor layer for blocking noise emitted by the supplied power. The conductive layer is grounded.

With the above implementation of the invention, the noise emission from the power supply unit to the surrounding area can be prevented by including the grounded conductive layer in the power supply unit. Thus, the power supply unit can supply electric power to light emitting means without having noise influence the semiconductor layer, the matrix substrate and the charge information process unit. Furthermore, the charge information process unit can be disposed freely without taking the arrangement of the power supply unit into consideration.

With the radiation detector of the present invention, the light emitted from the light emitting unit can be applied to the semiconductor layer, while the noise from light emitting means is blocked. Furthermore, the radiation can be detected accurately without fluctuations in detection sensitivity because the radiation is detected under a condition that the light is applied to the semiconductor layer.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

First Embodiment

The first embodiment of the present invention will be described, with reference to the drawings.

Figure 1:
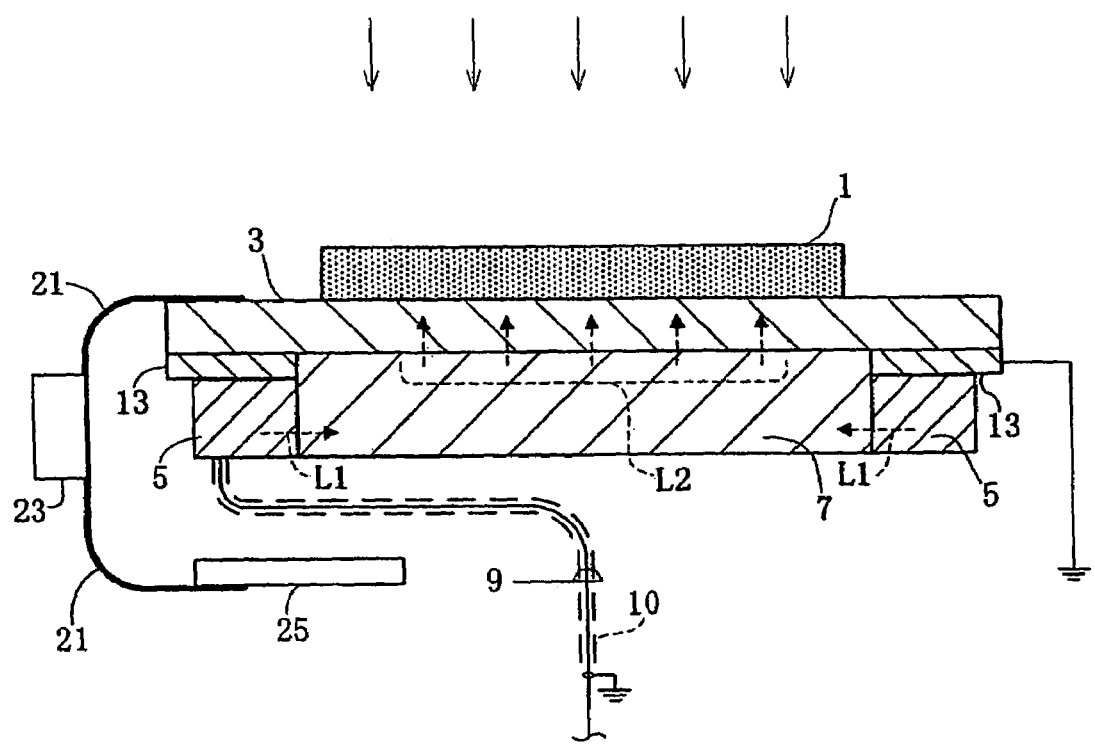
FIG. 1 is a cross-section showing the structure of a radiation detector according to a first embodiment.
Figure 2:
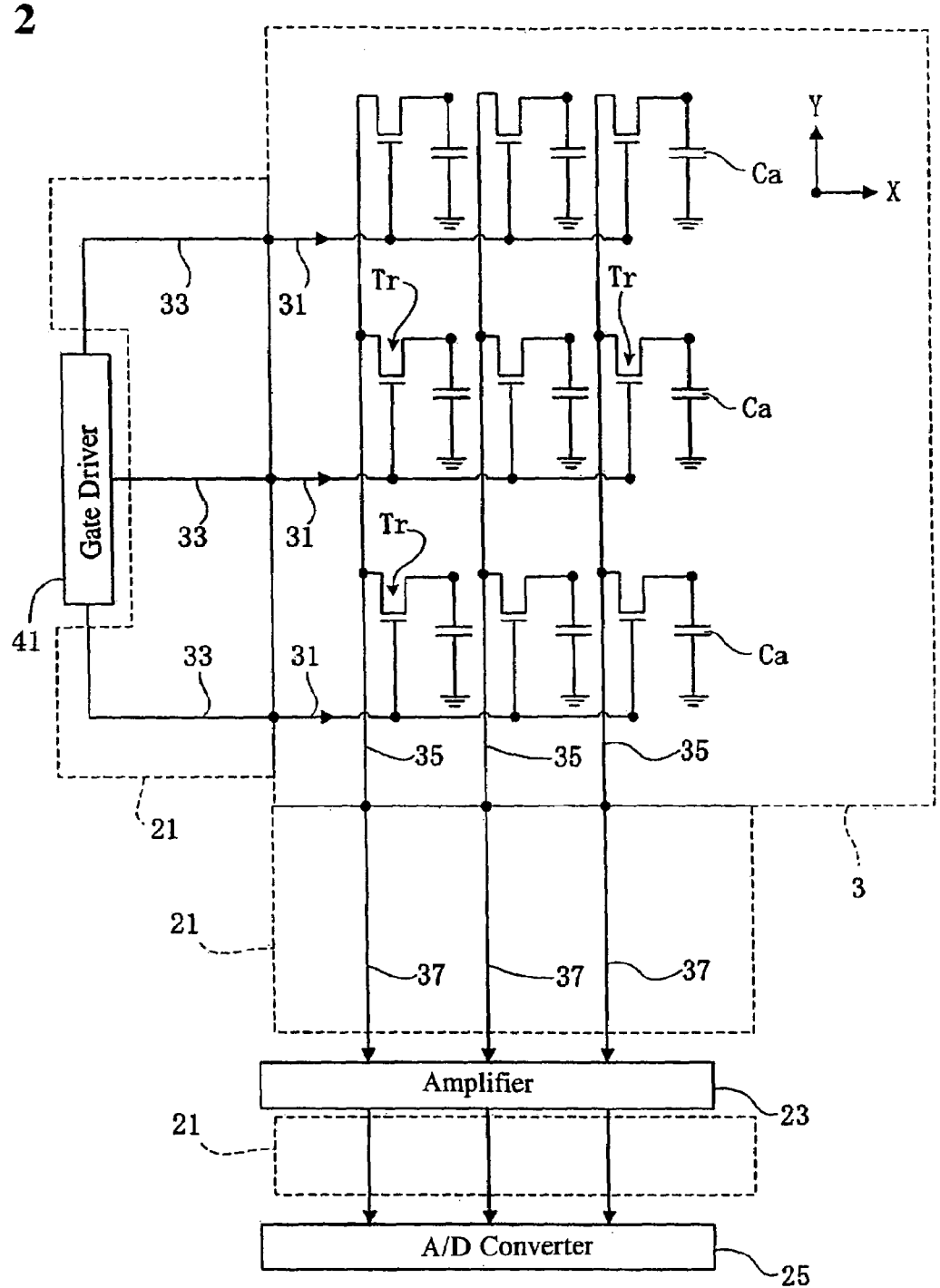
FIG. 2 is a simplified circuit diagram of an active matrix substrate, an amplifier and the like and a gate driver.

FIG. 1 is a cross-section showing the structure of a radiation detector according to a first embodiment and FIG. 2 is a simplified circuit diagram of an active matrix substrate, an amplifier and the like and a gate driver.

The radiation detector according to the first embodiment detects incident radiation to the direction of the solid line arrow as shown in FIG. 1. Radiation is, for example, X-ray and the like. The radiation detector is equipped with a radiation sensitive semiconductor thick film 1 and an active matrix substrate 3 that read out the charge information from the semiconductor thick film 1, wherein the semiconductor thick film 1 is formed on the surface of the active matrix substrate 3. A flat light guide 7 is disposed in the back side of the active matrix substrate 3 with the light emitting face of the flat light guide 7 directed to the active matrix substrate 3, wherein a light emitting unit 5 is disposed at the end face of the flat light guide 7. Furthermore, an electromagnetic shield 13 that blocks noise is disposed in the region between the active matrix substrate 3 and the light emitting unit 5 in the region where the light emitting unit 5 faces the active matrix substrate 3. Furthermore, a flexible substrate 21, an amplifier 23 and an AD converter 25 are connected electrically in series to the active matrix substrate 3.

The semiconductor thick film 1 converts radiation information to electric charge information directly and is formed from semiconductor materials exemplified by amorphous selenium and the like. An electrode (not shown in the figure) is formed in layers on the incident side of the semiconductor thick film 1, and bias voltage is applied thereon. Furthermore, carrier collecting electrodes, divided into multiple pieces, form a 2-dimensional matrix on the opposite side of the incident side of the semiconductor thick film 1, and collect the converted charge information. The semiconductor thick film 1 corresponds to the semiconductor layer in the present invention.

The active matrix substrate 3 collects the charge information using the carrier collecting electrode and reads it out, wherein the charge information is generated in the semiconductor thick film 1 that is formed in layers on the surface of the active matrix substrate 3. The active matrix substrate 3 will be explained concretely by referring FIG. 2. A capacitor Ca that stores the charge information and a Thin Film Transistor (TFT) Tr that is a switching element for taking out the charge information therefrom form a unit, and many of these units (1024×1024) are formed separately and arranged in a shape of 2-dimensional matrix with the carrier collecting electrodes described above.

Furthermore, the active matrix substrate 3 includes a gate line 31 that is connected to the gate of each Thin Film Transistor Tr and a data line 35 that is connected to the source of each Thin Film Transistor Tr. As shown in FIG. 2, multiple gate lines 31 are formed in parallel in the horizontal (X) direction and multiple data lines 35 are formed in parallel in the vertical (Y) direction. The active matrix substrate 3 corresponds to the active matrix substrate in the present invention.

The gate line 31 is led out by a gate distributing wiring 33 from the active matrix substrate 3 and connected electrically to a gate driver 41. The data line 35 is led out by a data distributing wiring 37 from the active matrix substrate 3 and connected to an amplifier 23 and an AD converter 25 in series. Each of the gate distributing wiring 33 and the data distributing wiring 37 are formed on the flexible substrate 21. The flexible substrate 21 shown in FIG. 1 contains data distributing wiring 37 formed thereon.

The gate driver 41 drives the active matrix substrate 3 to read out by delivering scanning signals for reading out electric charge to each Thin Film Transistor Tr through the gate distributing wiring 33 and the gate line 31. The amplifier 23 amplifies the charge information read out by the active matrix substrate 3. Furthermore, the AD converter 25 converts the amplified charge information into digital signals. The converted digital signals are output outside of the radiation detector from the other terminal of the AD converter 25 through a signal cable (not shown) or the like.

In FIG. 2, the gate driver 41 is disposed on one side of the X direction on the active matrix substrate and the amplifier 23 is disposed on one side of the Y direction as a matter of convenience. However, the gate driver 41 may be disposed on both side of the X direction in multiple numbers on the active matrix substrate 3. Also, the amplifier 23 and the AD converter 25 may be disposed similarly on both side of the Y direction in multiple numbers on the active matrix substrate 3.

As shown in FIG. 1, the flexible substrate 21 is folded, and the amplifier 23, the AD converter 25 and the like are properly disposed so that the internal space of the radiation detector is used with high efficiency. Also, the gate driver 41 and the like that are not shown in FIG. 1 are similarly disposed.

Furthermore, the amplifier 23 and the AD converter 25 are examples of the charge information management unit that converts and manages the charge information read out by the active matrix substrate 3 into signals to be output outside. Therefore, the charge information management unit will be subjected to design modifications appropriately according to the signals to be outputted outside and the composition is not restricted to that with the amplifier 23 and the converter 25 shown in the first embodiment.

The flat light guide 7, shaped like a plate, is disposed, with illuminating face up, on the active matrix substrate 3 in parallel therewith, wherein the flat light guide 7 is placed on the opposite side where the semiconductor thick film 1 is laid on the active matrix substrate 3. The light emitting unit 5 is disposed at the end face of the flat light guide 7. The flat light guide 7 receives, at its end face, light emitted by the light emitting unit 5. In FIG. 1, the dotted-line arrows L1 indicates the light emitted from the top face of flat light guide 7. The light entering the flat light guide 7 is uniformly dispersed toward the upper surface of the flat light guide 7. In FIG. 1, the dotted-line arrows L2 indicate the light dispersed from the upper surface of the flat light guide 7. The flat light guide 7 is made from a transparent material such as acryl, glass or the like and the end, upper and lower faces are made appropriately smoothly flat or subjected to micromachining. Furthermore, efficient use of light is improved by installing a light reflective sheet or the like.

The light emitting unit 5 contains a light emitter and a lighting circuit. The light emitter is disposed facing the end face of the flat light guide 7. The wave length of the light emitted from the light emitter is appropriately selected according to the semiconductor thick film 1 and the like, thus allowing the characteristics of the radiation detector to be modified. Various types of light emitters may be used; for example, a light emitting diode, a cold-cathode tube, an incandescent tube or a gas-discharge light source. Among light emitting diodes, the green light emitting diode with a peak light emitting wave length is about 570 nm is preferably used.

The lighting circuit turns on the light emitter using the power supplied from an outside source and is specifically designed for the kind of the light emitter employed. For example, if the light emitter is a light emitting diode, a current-limiting circuit is the lighting circuit and in case of a cold cathode tube, a voltage boosting circuit with an inverter corresponds to the lighting circuit.

A power distribution cable 9, which supplies power to the lighting circuit, is led into the light emitting unit 5 and connected to the lighting circuit. The power distribution cable 9 is a so-called shield cable in which a conductive layer 10 made from metal foil, metal braid or the like covers conductive wire that conducts electricity. One terminus of the conductive layer 10 is connected to a ground terminal. Furthermore, the outside power source that is connected to the other terminus is composed from a conventional switching power source.

The electromagnetic shield 13, which shields emitted noise, is disposed on the upper face of the light emitting unit 5. However, the electromagnetic shield 13 is not disposed above the flat light guide 7 so that it does not block the passage of the light from the flat light guide 7 to the semiconductor thick film 1 through the active matrix substrate 3. The electromagnetic shield 13 is disposed in the area between the light emitting unit 5 and the active matrix substrate 3 and where the light emitting unit 5 is facing the active matrix substrate 3. It is not necessary to make the light emitting unit 5 come into contact with the electromagnetic shield 13, but the larger the distance between them, the more difficult it is to shield the noise perfectly. Therefore, it is preferable to dispose the electromagnetic shield in contact with or nearby the light emitting unit 5.

The electromagnetic shield 13 is made of a conductive material and grounded. In the first embodiment, the electromagnetic shield 13 is plate-shaped. Examples of materials forming the electromagnetic shield 13 are metals such as aluminum, copper and the like. An aluminum plate is more preferable because it is light in weight and easy to process. The electromagnetic shield 13 may be grounded by connecting directly to the ground terminal or indirectly to the ground terminal through the casing of the radiation detector or the like, and finally to the ground.

Next, the operation of the first embodiment will be explained.

In the radiation detector, the light emitting unit 5 emits light before the incidence of radiation.

At this time the power distribution cable 9 supplies power from the switching power source, which is the outside power source, to the lighting circuit in the light emitting unit 5. Since the supplied power contains many switching pulses, the noise caused by the switching pulses is emitted from the conductive wire in the power distribution cable 9. However, the conductive layer 10 that is disposed around the conductive wire shields the emitted noise and lets it escape through the ground terminal that is connected to one end of the conductive layer 10. Therefore, the noise caused by the switching pulses is not emitted from the power distribution cable 9 to the surroundings.

Furthermore, the lighting circuit lights up the light emitter by receiving electric power from the distribution cable 9. Noise, caused not only by the switching pulses that were present in the supplied electric power but also by the lighting circuit itself, is emitted. However, the electromagnetic shield 13 blocks the noise emitted toward the active matrix substrate 3 and the semiconductor thick film 1 and lets it escape to the connected ground terminal. Because of this, unintentional charge information (noise component) caused by the noise is not generated in the semiconductor thick film 1 and the active matrix substrate 3. Therefore, the influence of the noise emitted from the light emitting unit 5 on the semiconductor thick film 1 and the active matrix substrate 3 can be suppressed.

The upper face of the flat light guide 7 emits a flat light by receiving the light from the light emitter at the end face of flat light guide 7. The flat light passes through the active matrix substrate 3 and is guided into the semiconductor thick film 1. An electric charge distribution pattern is formed in the semiconductor thick film 1 due to the incidence of light.

In this condition radiation is incident to the semiconductor thick film 1. The charge distribution pattern that is already formed in the semiconductor thick film 1 is not fluctuated by the incident radiation. There is no change in the condition of the lines of electric force in the semiconductor thick film 1 or in the size of the sensitive area. Therefore, the radiation information is converted into the charge information without inducing fluctuations in detection sensitivity The capacitor Ca in the active matrix substrate 3 collects the charge information from the semiconductor thick film 1 and stores it. The gate driver 41 sequentially selects the gate distributing wiring 33 and sends scanning signals. These signals are received directly by the gate of the thin film transistor Tr through the gate line 31. Through this process the data line 35 reads out the electric charge information stored in the capacitor Ca, through the thin film transistor Tr, which is turned on. The amplifier 23 receives the charge information that is read out through the data distribution wiring 37. In the amplifier 23, the charge information is first converted to the voltage information and then the voltage information is amplified. Furthermore, the AD converter 25 converts the voltage information to digital signals, and the digital signals are output outside of the radiation detector.

For example, when the radiation detector of the first embodiment is used for detecting an X-ray image of an X-ray fluoroscope, the digital signals that are output outside through the amplifier 23 and the like are used as the image information for generating an X-ray fluorographic image.

By providing the electromagnetic shield 13 in the radiation detector described above, the noise emitted from the light emitting unit 5 toward the active matrix substrate 3 or the semiconductor thick film 1 is blocked. Thus the influence of noise that is caused by the switching pulses sent to the active matrix substrate 3 and the semiconductor thick film 1, and by the lighting circuit may be suppressed. Since the charge information that is converted by the semiconductor 1 and read out by the active substrate 3 is so weak, the effect of noise suppression is great.

Furthermore, the emission of the noise, which is caused by the switching pulses and emitted from the distribution cable 9 to the surroundings, can be prevented. Thus, the influence of the noise from the distribution cable 9 to the semiconductor thick film 1, the active matrix substrate 3, the charge information managing unit such as the amplifier 23 and the AD converter 25, as well as the gate driver 41 can be suppressed. Due to this improvement, arrangements of the parts in the radiation detector can be made more freely without taking the influence of the noise into consideration; for example the amplifier may be disposed at the spot where the flexible substrate 21 is folded back rather than on the active matrix substrate 3.

In addition, the radiation incidence does not induce fluctuations of the charge distribution in the semiconductor thick film 1 because the light emitted from the light emitting unit 5 is led to the semiconductor thick film 1 before the radiation incidence. Therefore, the semiconductor thick film 1 is able to convert the radiation information to the charge information accurately, without fluctuations in radiation detection sensitivity.

Second Embodiment

Next, the second embodiment of the present invention will be explained. When the composition is the same as the first embodiment, detailed explanations are omitted and the same marks are used.

Figure 3:
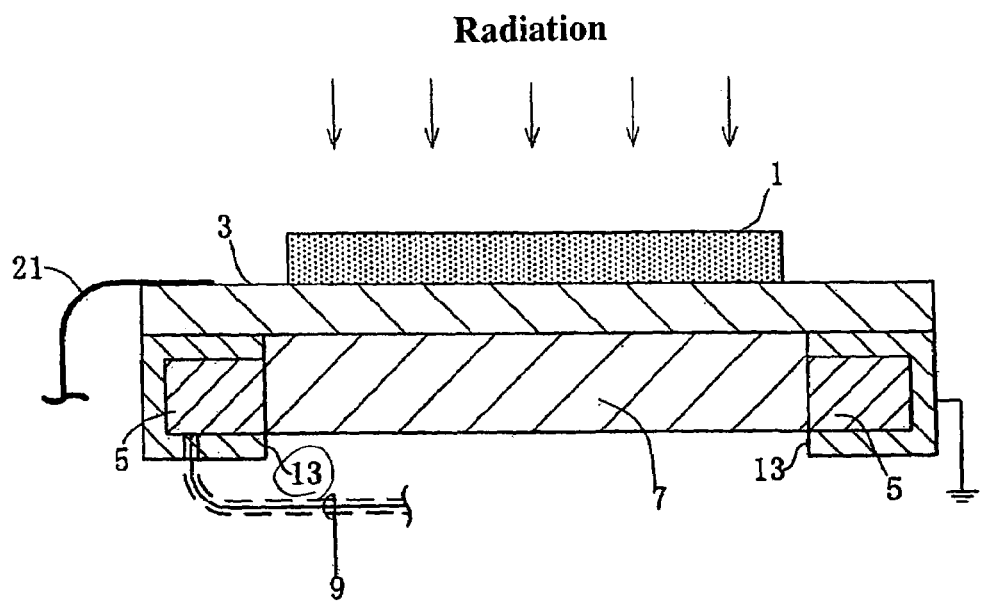
FIG. 3 is a cross-section showing the structure of a radiation detector according to a second embodiment.

FIG. 3 is a simplified drawing showing the structure of a radiation detector according to a second embodiment.

The radiation detector according to the second embodiment contains an electromagnetic shield 13 that surrounds the light emitting unit 5. An opening is disposed on the electromagnetic shield 13 so that the light emitting unit 5 is allowed to emit light to an end face of the flat light guide 7. Thus, the electromagnetic shield 13, the vertical cross-section of which is shaped like a rectangle without one side, surrounds the light emitting unit 5. The opening, through which the light emitting unit 5 can illuminate, is located at the surface facing the flat light guide 7. Of course the electromagnetic shield 13 of the second embodiment is also made from a conductive material and grounded.

With this electromagnetic shield 13, the noise emitted from sources other than the upper face of the light emitting unit 5 can be blocked. Thus, the influence of the noise can be suppressed not only in the semiconductor thick film 1 and the active matrix substrate 3 but also in the amplifier 23 and the AD converter 25.

The invention is not limited to the embodiments described above and the following modifications can be made.

Figure 4:
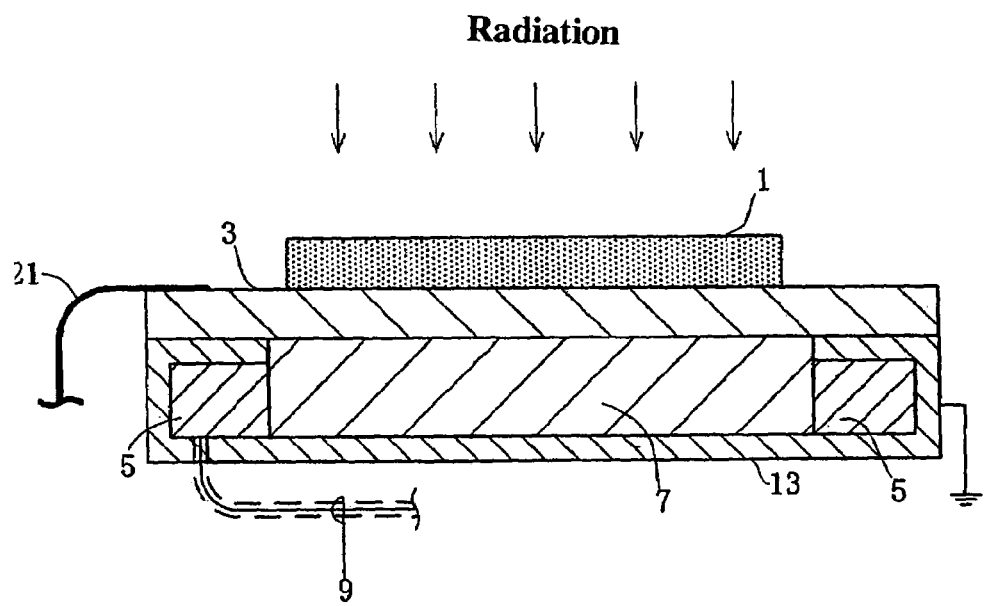
FIG. 4 is a cross-section showing the structure of a radiation detector according to an alternative embodiment.
Figure 5:
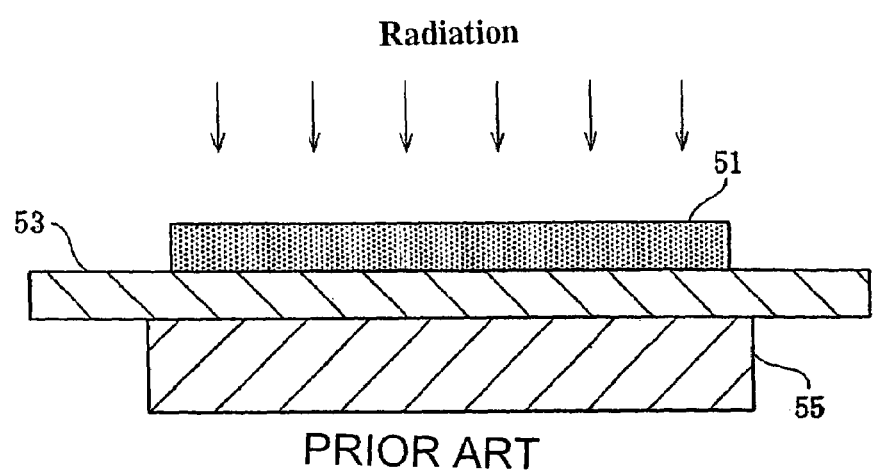
FIG. 5 is a cross-section showing the principal part of a conventional radiation detector.
Figure 6:
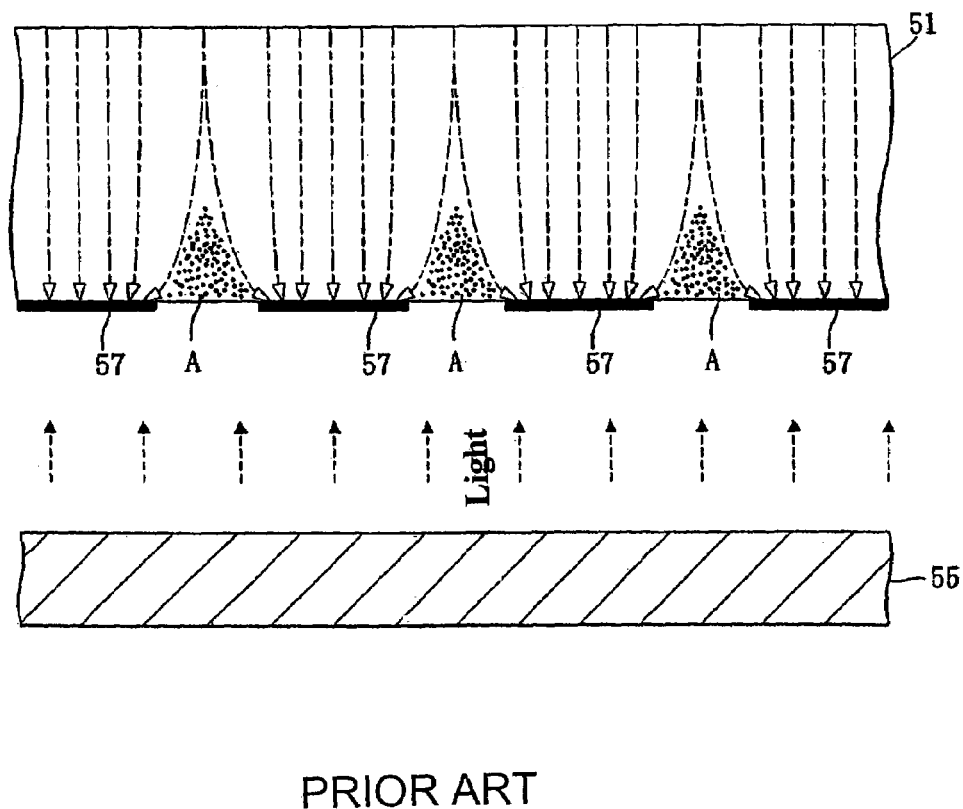
FIG. 6 is a diagram showing the action of the principal part of a conventional radiation detector.

In the first or second embodiment, the electromagnetic shield 13 shields one part or around the light emitting unit 5. However, the structure of the electromagnetic shield 13 is not restricted to these. FIG. 4 shows the electromagnetic shield 13 in a radiation detector related to an alternative example. As shown in the figure, the electromagnetic shield 13 may surround the light emitting unit 5 with an opening that allows the light emitting unit 5 to emit light to the end face of the flat light guide 7 while also covering the bottom face of the flat light guide 7. In another word, the electromagnetic shield 13 is the electromagnetic shield 13 of the second embodiment with the addition of an electromagnetic shield to the bottom face of the flat light guide 7. With this modification the noise emitted from the bottom face of the flat light guide 7 can be blocked. Furthermore, the electromagnetic shield 13 may take a shape of an open-top flat box. This structure allows the electromagnetic shield 13 to function as a support member that hold the light emitting unit 5 and the flat light guide 7 with sufficient strength, thereby simplifying the structure.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A two-dimensional radiation detector comprising:
   a semiconductor layer for converting radiation information into electric charge information when there is an incidence of radiation;

an active matrix substrate, on the surface of which said semiconductor layer is laid, for reading said electric charge information from said semiconductor layer;

light emitting means for emitting light;

a flat light guide placed on the reverse side of said active matrix substrate for receiving light through an end face from said light emitting means and guiding said light to said semiconductor layer by way of said active matrix substrate, wherein an electromagnetic shield is disposed in a region between said light emitting means and said active matrix substrate where said light emitting means faces said active matrix substrate.

2. A two-dimensional radiation detector according to claim 1, wherein said electromagnetic shield surrounds the light emitting means and an opening is disposed thereon so that said light from said light emitting means may be applied to said end face of said flat light guide.

3. A two-dimensional radiation detector according to claim 1 wherein said detector further includes power distributing means for supplying power from an external power supply to said light emitting means.

4. A two-dimensional radiation detector according to claim 3, wherein said power distributing means includes a conductor layer for blocking noise emitted by the supplied power.

5. A two-dimensional radiation detector according to claim 4, wherein said conductive layer is grounded.

6. A two-dimensional radiation detector comprising:

a semiconductor layer for converting radiation information into electric charge information when there is an incidence of radiation;

an active matrix substrate, on the surface of which said semiconductor layer is laid, for reading said electric charge information from said semiconductor layer;

light emitting means for emitting light disposed outside a radiation detection area of the semiconductor layer;

a flat light guide placed on the reverse side of said active matrix substrate for receiving light through an end face from said light emitting means and guiding said light to said semiconductor layer by way of said active matrix substrate, wherein an electromagnetic shield is disposed in a region between said light emitting means and said active matrix substrate where said light emitting means faces said active matrix substrate.

* * * * *